(12) United States Patent
Fleischer et al.

(10) Patent No.: US 8,433,199 B2
(45) Date of Patent: Apr. 30, 2013

(54) SYSTEM AND METHOD FOR NONLINEAR SELF-FILTERING VIA DYNAMICAL STOCHASTIC RESONANCE

(75) Inventors: Jason W. Fleischer, Princeton, NJ (US); Dmitry V. Dylov, Princeton, NJ (US)

(73) Assignee: Princeton University, Princeton, NJ (US)

( * ) Notice: Subject to any disclaimer, the term of this patent is extended or adjusted under 35 U.S.C. 154(b) by 976 days.

(21) Appl. No.: 12/406,918

(22) Filed: Mar. 18, 2009

(65) Prior Publication Data

US 2010/0020204 A1    Jan. 28, 2010

Related U.S. Application Data

(60) Provisional application No. 61/069,822, filed on Mar. 18, 2008.

(51) Int. Cl.
*H04B 10/00* (2006.01)
*H01S 3/00* (2006.01)

(52) U.S. Cl.
USPC .................. 398/140; 398/118; 359/337.2

(58) Field of Classification Search .............. 359/237, 359/242, 337.2, 618; 398/140, 39, 118, 141
See application file for complete search history.

(56) References Cited

U.S. PATENT DOCUMENTS

| | | | |
|---|---|---|---|
| 4,741,587 A | 5/1988 | Jewell et al. | |
| 5,574,369 A | 11/1996 | Hibbs et al. | |
| 6,008,642 A | 12/1999 | Bulsara et al. | |
| 6,043,927 A | 3/2000 | Islam | |
| 6,717,718 B1 * | 4/2004 | Kelsoe et al. | 359/333 |
| 7,948,610 B2 * | 5/2011 | Hintz et al. | 356/4.01 |
| 2002/0163684 A1 * | 11/2002 | Lu et al. | 359/110 |
| 2002/0189757 A1 * | 12/2002 | Denton et al. | 156/345.27 |
| 2003/0206740 A1 * | 11/2003 | Lee et al. | 398/79 |
| 2006/0251424 A1 * | 11/2006 | Nicholson et al. | 398/141 |
| 2007/0092264 A1 * | 4/2007 | Suzuki et al. | 398/189 |

* cited by examiner

*Primary Examiner* — Dawayne A Pinkney
(74) *Attorney, Agent, or Firm* — 24IP Law Group; Timothy R. DeWitt

(57) ABSTRACT

A system and method for filtering and enhancing signals from a noise background based on the nonlinear interaction of waves. The system and method amplify low-level signals, hide information in the signals, and then nonlinearly recover the signals. With the present invention, this can be performed for both spatial beams and temporal pulses. The signal self-filters and self-amplifies at the expense of the surrounding noise via the nonlinear medium.

18 Claims, 8 Drawing Sheets

SYSTEM AND METHOD FOR NONLINEAR SELF-FILTERING VIA DYNAMICAL STOCHASTIC RESONANCE

CROSS-REFERENCE TO RELATED APPLICATIONS

The present application claims the benefit of the filing date of U.S. Provisional Patent Application Ser. No. 61/069,822 entitled "Signal amplification via nonlinear/incoherent coupling" and filed by the present inventors on Mar. 18, 2008.

The aforementioned provisional patent application is hereby incorporated by reference in its entirety.

STATEMENT REGARDING FEDERALLY SPONSORED RESEARCH OR DEVELOPMENT

This invention was made with government support under PHY-0605976 awarded by the National Science Foundation, FA9550-06-1-0123 awarded by the Air Force Office of Scientific Research, and DE-FG02-08ER55001. The government has certain rights in the invention.

BACKGROUND OF THE INVENTION

1. Field of the Invention

The present invention relates to a system and method for filtering and enhancing signals from a noise background.

2. Brief Description of the Related Art

In linear systems, noise is considered detrimental to signal; in nonlinear systems, the relationship is more complex. While increased intensity leads to wave mixing of the signal components, creating effective noise, nonlinear coupling can lead to an energy exchange in which the signal grows at the expense of the noise. This amplification only holds for certain parameter ranges, e.g. noise and coupling strengths, that give rise to the term "stochastic resonance". The effect occurs throughout science, from climatic patterns to electrical systems to biology, but mostly in the context of one-dimensional signals that spike above a threshold. For example, many works have focused on neuronal activity in vision but little attention has been paid to the images themselves.

In the past, the stochastic resonance phenomenon has been applied in a variety of systems. For example, in U.S. Pat. No. 5,574,369 entitled "Detection and Communications Device Employing Stochastic Resonance," Hibbs et al. disclosed a device employing the stochastic resonance phenomenon to perform amplification of a signal by increasing the amplitude of a signal input into the device through the external addition of noise at the input. The central element of the Hibbs et al. system was a super-conducting loop interrupted by one or more Josephson junctions.

Further, in U.S. Pat. No. 6,008,642, entitled "Stochastic Resonance Detector for Weak Signals," Bulsara et al. disclosed a stochastic resonator signal detector comprising a multi-stable nonlinear device for coupling to an input signal and a control signal coupled to the multi-stable nonlinear device for varying asymmetry among stable states of the multi-stable nonlinear device. The interaction of the input signal with the control signal in the multi-stable nonlinear device generated an output signal having an amplitude responsive to the input signal amplitude and a frequency range that comprised harmonics of products of the control signal and the input signal.

The nonlinear coupling between signal and noise, usually in the context of intensity-dependent clicks of a detector, is a generic problem in information physics. Despite this, the interaction has received little attention in imaging. See, Simonotto, E. et al., "Visual perception of stochastic resonance," *Physical Review Letters* 78 (6), 1186-1189 (1997); Vaudelle, F., Gazengel, J., Rivoire, G., Godivier, X., & Chapeau-Blondeau, F., "Stochastic resonance and noise-enhanced transmission of spatial signals in optics: the case of scattering," *Journal of the Optical Society of America B-Optical Physics* 15 (11), 2674-2680 (1998).

SUMMARY OF THE INVENTION

In a preferred embodiment, the present invention is a method for recovering a signal. The method comprises the steps of coupling a signal and incoherent background noise together to produce a mixed signal, propagating the mixed signal over a distance in a nonlinear medium to amplify the signal at the expense of the incoherent background noise, and extracting said signal from said mixed signal by tuning a parameter of said mixed signal. The step of extracting said signal may comprise any or all of tuning the nonlinearity of the medium, the intensity of the background noise, the statistics of the noise, a wavelength of the light, or other parameters. The step of coupling said signal and said incoherent background noise may comprise combining said signal and said background noise in, for example, a self-focusing photorefractive crystal and may further comprise varying an applied voltage across a crystalline c-axis of said self-focusing photorefractive crystal. The signal-to-noise ratio may be fixed to completely obscure said signal. The statistics of the noise may be controlled, for example, by an imaging lens and the step of tuning the statistics of the noise may comprise controlling said imaging lens. The signal being recovered may be an image signal. The incoherent background noise may comprise diffused laser light.

In another preferred embodiment, the present invention is a system for recovering a signal. The system comprises means for coupling a signal and incoherent background noise together to produce a mixed signal, means for propagating the mixed signal over a distance, and means for recovering a signal of interest by tuning a parameter of the system. The parameter may be selected from the group of the strength of the nonlinearity of the medium, the intensity of the incoherent background noise, the statistics of the incoherent background noise and a light wavelength, but also may be a different parameter.

In still another embodiment, the present invention is a system for recovering an image signal. The system comprises a receiver or input for receiving or inputting a signal of interest, a source of incoherent noise, a combiner for coupling said signal of interest to incoherent background noise from said source of incoherent noise to produce a mixed signal, a propagation medium connected to said combiner for propagating said mixed signal over a distance, a camera for receiving said mixed signal after it propagates over said distance, and a controller for tuning parameters of said combiner and said source of incoherent noise.

In a preferred embodiment, the present invention is a system and method for filtering and enhancing signals from a noise background based on the nonlinear interaction between waves. The system and method amplify low-level signals, hide information in the signals, and then nonlinearly recover the signals. With the present invention, this can be performed for both spatial beams and temporal pulses. The signal self-filters and self-amplifies at the expense of the surrounding noise via the nonlinear medium. This is a form of coherence gating/squeezing and differs from other techniques in its self-action and improvement over propagation distances. For example, traditional coherence gating in photorefractive media requires the addition of a reference beam coherent with the signal, so that interference in the medium records a volume hologram of the signal. In this process, only the signal forms the recording pattern; the incoherent noise diffracts from the induced grating. In the recording stage, noise serves no constructive role, and there is actually less advantage to the propagation distance, as noise and wave-mixing effects degrade the quality of the hologram. In the present invention, the signal grows at the expense of the noise, and the process becomes more effective the longer the propagation distance. Depending on the medium, the method can be instantaneous and requires simpler algorithms to execute.

Still other aspects, features, and advantages of the present invention are readily apparent from the following detailed description, simply by illustrating a preferable embodiments and implementations. The present invention is also capable of other and different embodiments and its several details can be modified in various obvious respects, all without departing from the spirit and scope of the present invention. Accordingly, the drawings and descriptions are to be regarded as illustrative in nature, and not as restrictive. Additional objects and advantages of the invention will be set forth in part in the description which follows and in part will be obvious from the description, or may be learned by practice of the invention.

BRIEF DESCRIPTION OF THE DRAWINGS

For a more complete understanding of the present invention and the advantages thereof, reference is now made to the following description and the accompanying drawings, in which:

FIG. 3(a)-(c) illustrate a simulation of traditional stochastic resonance in digital (binary) systems, showing noise-assisted development of a signal whose intensity is below a detector threshold. Addition of noise allows pixels to spike above the threshold, a, until an optimal noise density is reached, b, beyond which the signal is lost again, c. FIGS. 3(d)-(f) illustrate experimental results of dynamical stochastic resonance in accordance with a preferred embodiment of the present invention. Here, the nonlinear strength is fixed at $\delta n=1.7\times10-4$. Shown are output pictures for noise correlation lengths of d: 48 μm, e: 110 μm, and f: 185 μm. Insets show schematic comparison of the image feature size vs. the underlying speckle size (correlation length) of the noise. Optimal transmission occurs when these two characteristic lengths are equal. The scale bar in d is 25 μm.

FIG. 7(a) shows the dependence of gain rate on coupling strength $\delta n$ as the number of modes M is increased.

DETAILED DESCRIPTION OF THE PREFERRED EMBODIMENTS

Figure 1A:
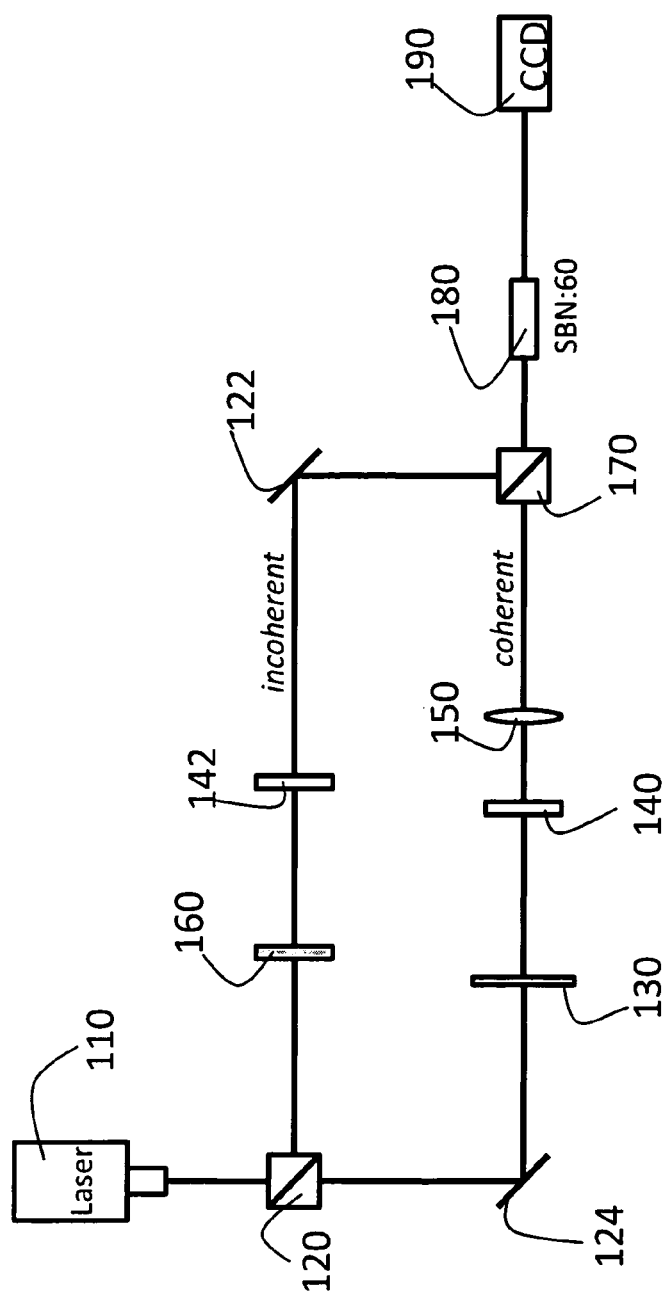
FIG. 1(a) is a block diagram of an experimental setup illustrating a preferred embodiment of the present invention. Laser CW beam is split into two parts: the first one is coherent and contains weak (attenuated) mask signals (FIG. 1(b)); the other part is made partially spatially incoherent (the "noise") by passing it through ground-glass diffuser that has scattering speckles on its surface. Both components are then recombined and their indiscernible mixture (FIG. 1(c)) is sent to nonlinear photorefractive crystal (SBN:60); the nonlinearity of the medium is controlled by external voltage bias. Output pictures are captured by a digital camera (CCD detector). The original goal is to recover hidden image from the incoherent noise.

The present invention filters and enhances signals from a noise background based on the nonlinear interaction between waves. The invention can be used to amplify low-level signals, hide information in the signals, and then nonlinearly recover the signals. This can be performed for both spatial beams and temporal pulses. The signal self-filters and self-amplifies at the expense of the surrounding noise via the nonlinear medium. This is a form of coherence gating/ squeezing and differs from other techniques in its self-action and improvement over propagation distances. With the present invention, the signal grows at the expense of the noise, and the process becomes more effective the longer the propagation distance. Depending on the medium, the method can be instantaneous and requires simpler algorithms to execute.

In a preferred embodiment, a method in accordance with the present invention comprises the steps of coupling a signal of interest and noise together and then tuning various parameters such as the strength of nonlinearity, the intensity of the noise, the statistics of the noise, and the wavelength of the light to recover the signal of interest.

This may be done, for example, with a low level signal such as an image taken at night. Noise is added to the signal in effect to bring out the signal. The method of the present invention also may be used with a signal of interest that already is immersed in noise, i.e., it is a noisy signal.

The presence of any fully-coherent component fundamentally alters wave propagation, e.g. by removing thresholds for instability and introducing new characteristic length scales. For information-bearing waves, such as images, their coupling with noise represents a new type of stochastic resonance (SR). As with other types of SR, including coherence resonance, signal amplification occurs at the expense of the background. Unlike previous examples, however, the dynamical system of the present invention is not bistable or excitatory and the resonance requires no feedback or detector threshold. As described herein the effect is demonstrated using light waves, but the dynamical stochastic resonance will hold for any statistical wave system with coherent-incoherent coupling. It will also hold in situations where the signal is partially-incoherent and the noise is more incoherent.

An example to demonstrate the present invention is described with reference to FIG. 1. The signal is a coherent image of a resolution chart (shown in FIG. 1(b)) and the noise is diffused laser light. Light from a laser 110 is split by beam splitter 120 into two parts. The first part is coherent and contains a weak (attenuated) mask signal, such as by passing the part through a resolution chart 130. The signal also may be passed through an attenuator 140. The second part is made spatially incoherent (the "noise") by passing it into a groundglass diffuser 160 that has scattering speckles on its surface to produce an incoherent signal, or noisy background. The noise signal likewise may pass through an attenuator 142. Both parts are then redirected, for example via interferometers 122, 124 and beam splitter 170 and are recombined to produce an indiscernible mixture (shown in FIG. 1(c)). The signal-to-noise intensity ratio is fixed at 1:10, so that the signal is completely obscured, while the noise statistics (correlation length $l_c$) is controlled by an imaging lens 150. Coupling between the components takes place in a photorefractive SBN:60 ($Sr_{0.6}Ba_{0.4}Nb_2O_6$) crystal 180, whose nonlinearity can be controlled by varying an applied voltage bias across the crystalline c-axis. Light exiting the nonlinear crystal is then imaged into a CCD camera 190.

Figure 8:
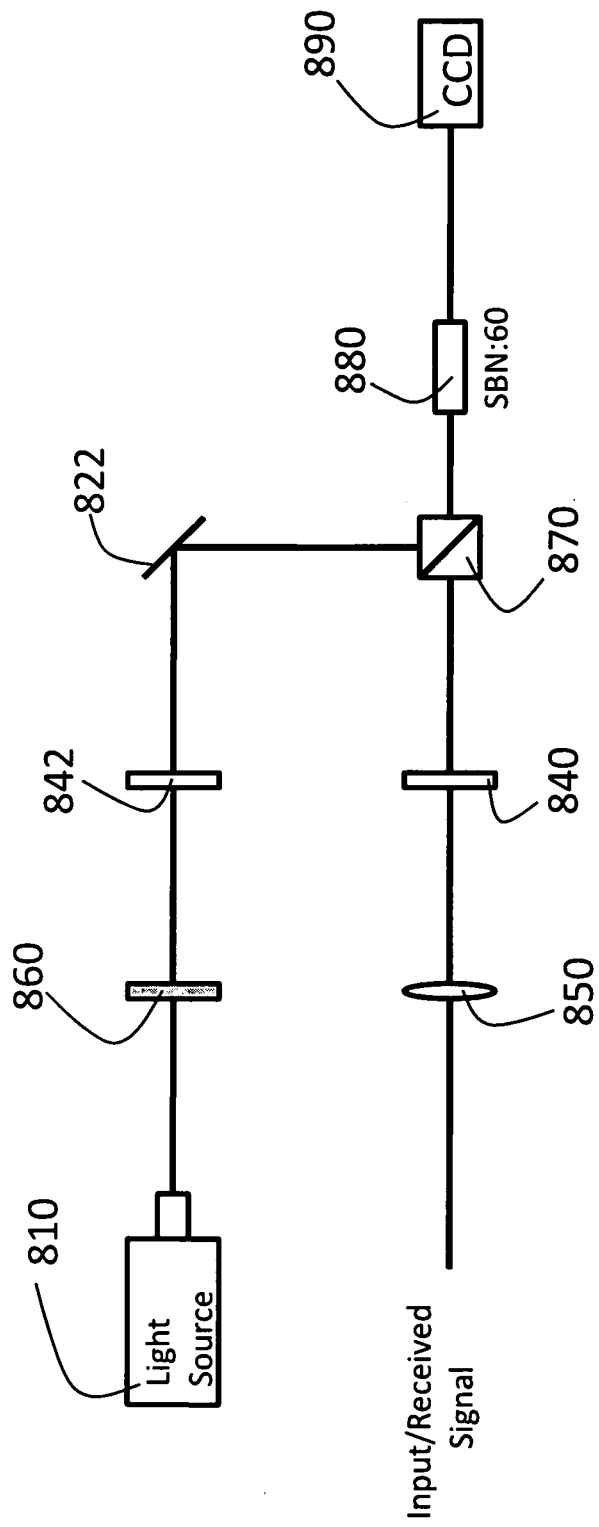
FIG. 8 is a block diagram of a system in accordance with a preferred embodiment of the present invention.

A preferred embodiment may take the form shown in FIG. 8, in which a signal of interest is input or received by the system. Light from a randomized light source 810, which can be a laser passed through a diffuser 860 or any other randomized light source to produce an incoherent noise background signal and the possibly passes through an attenuator 842 and then is redirected by interferometer 822 to beam splitter 870. A diffusor is shown here as an example, and other methods of generating incoherent noise may be used with the invention. The input or received signal is passed through an imaging lens 850 and possibly an attenuator 840 to beam splitter 870. The two signals are combined in a combiner such as a photorefractive crystal and then passed to a CCD camera. While a photorefractive crystal is shown and described here as the combiner, other known elements and methods for combining the signals may be used. Similarly, while attenuators 840, 842 are shown here, it will be apparent that such elements are not necessary with the present invention, but rather, are merely shown as one potential embodiment. Other embodiments of the invention will be apparent to those of skill in the art.

Figure 2:
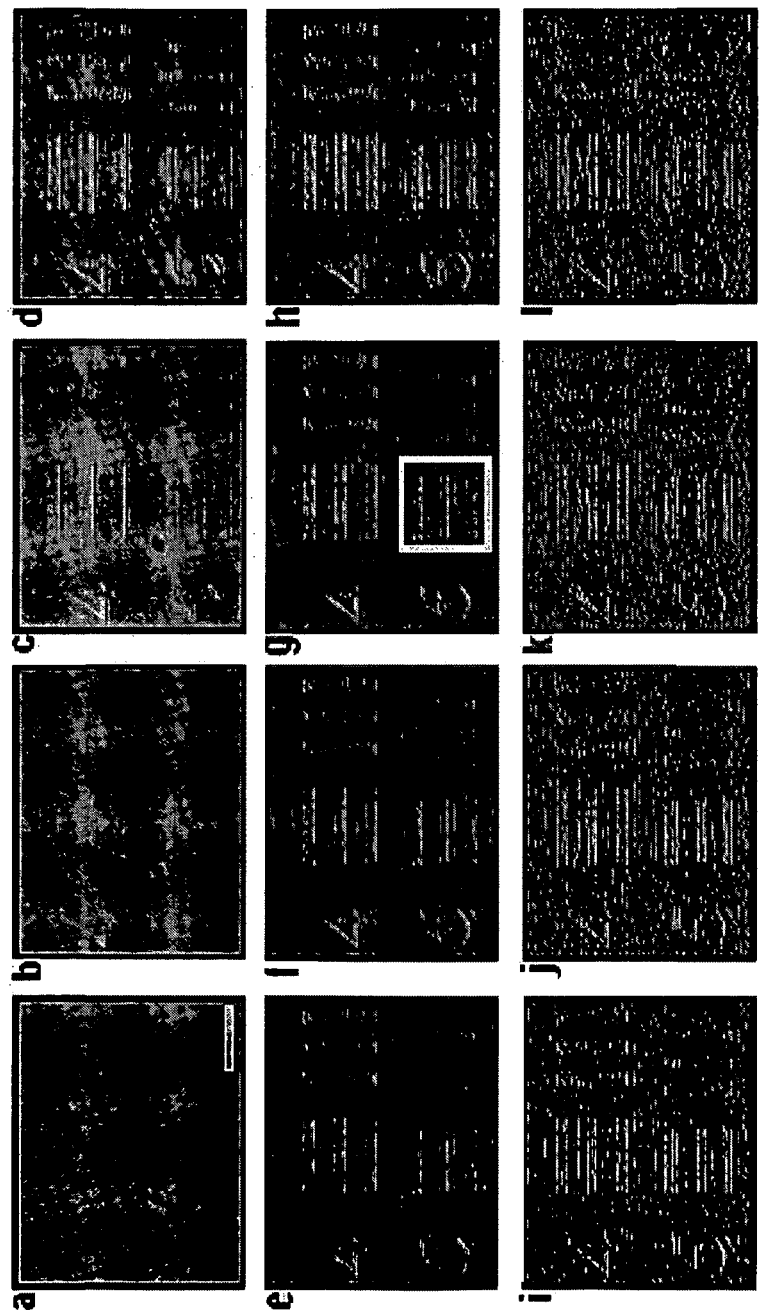
FIG. 2 is a series of diagrams illustrating non-linear self-filtering in accordance with a preferred embodiment of the present invention as signal noise coupling strength is increased. The correlation length is fixed at $l_C=110$ μm. Output pictures are shown for nonlinear index changes $\delta n$ of (a) 0, (b) $0.6\times10^{-4}$, (c) $1.1\times10^{-4}$, (d) $1.4\times10^{-4}$, (e) $1.7\times10^{-4}$, (f) $1.9\times10^{-4}$, (g) $2.2\times10^{-4}$, (h) $2.4\times10^{-4}$, (i) $2.7\times10^{-4}$, (j) $3.2\times10^{-4}$, (k) $3.6\times10^{-4}$, and (l) $3.9\times10^{-4}$. As the nonlinearity is increased, the signal grows at the expense of noise until a peak value at I, above, which the energy transfer goes the other way. Note that the horizontal bars of the chart are the most distinct part of the signal, a direct result of the crystal anisotropy. These bars, highlighted by the box in (g), are used for the cross-correlation measurements shown in FIG. 4. The scale bar in (a) is 100 μm.

To understand the system and method of the present invention, first consider the output image as a function of nonlinearity, for fixed intensity ratio and correlation length (FIG. 2). As the nonlinearity is increased, the signal becomes more and more visible, noticeable both as the chart develops and as the background (uniform regions of the chart) become darker. The signal-to-noise ratio improves until a maximum is reached (FIG. 2(g)), beyond which the signal quality degrades. As a measure of the energy transfer, we take the spatial correlation of the output with an idealized (binary) chart input, $C_{o,i} = \langle \psi(x,z=0) | \psi_s(x,z=L) \rangle$, integrated over the 2D array of pixels (FIG. 4a).

Figure 3:
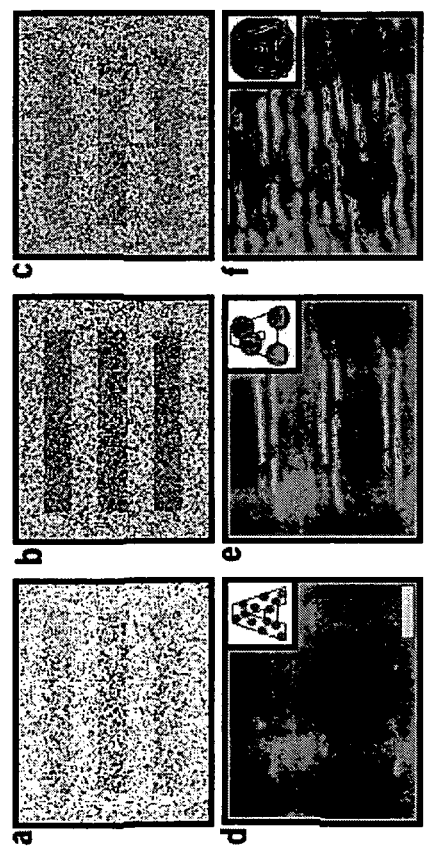
FIG. 3 is a series of diagrams illustrating nonlinear evolution of signal as function of noise statistics in accordance with a preferred embodiment of the present invention.

This observation is different than traditional stochastic resonance experiments, in which the coupling is held fixed and the level of the noise is changed[2]. An example of this in the case of images is shown in FIG. 3. The top row shows a typical, threshold-based SR experiment, in which noise is added to a grayscale signal whose intensity is below a detector threshold. Adding noise allows the signal to develop (FIG. 3b) until increased noise density destroys it again (FIG. 3c); in this case, the on/off nature of the detector acts as a nonlinear element to couple the components. For the dynamical case here, simply raising the intensity of the noise (not shown) had little effect on the quality of the signal. Instead, changing the density of the noise, i.e. the correlation length, elicited resonant behavior (FIGS. 3d-f and FIG. 4b).

Previous theories emphasized the signal, driven by the noise. This approach was used by Mitra and Stark, for example, who showed theoretically that nonlinearity limits the information capacity of an optical communications system. See, Mitra, P. P. & Stark, J. B., "Nonlinear limits to the information capacity of optical fibre communications," Nature 411 (6841), 1027-1030 (2001). However, to make the problem analytically tractable, they ignored coherent modemixing within the signal, neglecting its self-phase modulation and treating the cross-phase modulation between components as a random noise variable. The result, a Gaussian rollover in the signal intensity, is qualitatively correct, but the approximations used have made this paper controversial. Moreover, the power necessary to obtain the rollover, particularly when distributed over many wavelengths, has prohibited observation of the effect.

In contrast to the previous work, the present invention focuses on the response of the noise to the driving signal. This is consistent with the low-level signal and allows a more proper treatment of the incoherent dynamics. The radiation transfer approach of Equation (1) is used, $$\frac{\partial f}{\partial z} + \beta k \cdot \frac{\partial f}{\partial r} + \frac{\partial \langle \Delta n \rangle}{\partial r} \cdot \frac{\partial f}{\partial k} = 0, \quad (1)$$

where f(r,k,z) is the phase-space (Wigner) distribution of the light, $\beta = \lambda/2\pi n_0$, is the diffraction coefficient for light of wavelength $\lambda$ in a medium with base index of refraction $n_0$, and $\Delta n$ is the nonlinear index change. For simplicity, it is assumed that an inertial Kerr nonlinearity, $\Delta n = \gamma \langle I \rangle_\tau$ with a phase-independent, time-averaged response to the intensity $I=I(x,y,z)=\int f dk$ and reduce the discussion to one transverse dimension. These approximations are consistent with the slow and anisotropic response of the photorefractive crystal but ignore the true 2D nature of the nonlinearity (e.g. saturation effects). Note also that in this form, the noise is multiplicative, through $\Delta n$, rather than additive. Nevertheless, the present invention also may be used with noise that is additive.

As a first step, the linear response of the incoherent light by itself is considered. The discussion is divided into three parts. Part 1 covers the basic derivation of the dispersion relation, showing explicitly how the nonlinear propagation of partially-coherent light can be treated as a photonic plasma. Its main result is the derivation and explanation of the gain rate. Part 2 covers interactions between a coherent wave and a partially-coherent background. Exact analytical results show that the presence of any coherent component eliminates thresholds for instability and define new characteristic length scales. Finally, part 3 describes the influence of signal mode structure on the coherent-incoherent dynamics.

1. Derivation of Dispersion Relation for Spatially-Incoherent Light

First consider the paraxial approximation for beam propagation:

$$i\frac{\partial \psi}{\partial z} + \frac{\beta}{2}\nabla_\perp^2 \psi + \langle \Delta n \rangle_\tau \psi = 0 \quad (2)$$

where $\psi$ is the slowly-varying amplitude of the electric field, $\beta = \lambda/2\pi n_0$ is the diffraction coefficient for light of wavelength $\lambda$ in a medium with base index of refraction $n_0$, and $\Delta n$ is the time-averaged response of the nonlinear medium. Applying the Wigner transform, defined by $$f(r, k, z) = \frac{1}{2\pi}\int_{-\infty}^{+\infty} d\zeta \langle \psi_N^*(r+\zeta/2, z) \cdot \psi_N(r-\zeta/2, z)\rangle e^{ik\cdot\zeta} \quad (3)$$

gives the Wigner-Moyal equation $$\frac{\partial f}{\partial z} + \beta k \cdot \frac{\partial f}{\partial r} + 2\Delta n\left[\sin\left(\frac{1}{2}\frac{\vec{\partial}}{\partial r}\frac{\vec{\partial}}{\partial k}\right)\right]f = 0, \quad (4)$$

where the arrows in the sine operator indicate that the spatial derivative acts on the index change and the momentum derivative acts on the distribution.

To build intuition, a purely incoherent spatial beam is considered. In Part 2, the results will be generalized to include contributions from coherent components as well.

A. Weak Nonlinear Coupling

To lowest order, Eq. (4) becomes the radiation transport equation (1) used in the text:

$$\frac{\partial f}{\partial z} + \beta k \cdot \frac{\partial f}{\partial r} + \frac{\partial \langle \Delta n \rangle}{\partial r} \cdot \frac{\partial f}{\partial k} = 0, \quad (5)$$

Linearizing this for $f(x,k,z)=f_0(k)+f_1 \exp[i(\alpha x - gz)]$ gives:

$$1 + \alpha\gamma \int_{-\infty}^{\infty} dk_x \frac{\frac{\partial f_0}{\partial k_x}}{g - \alpha\beta k_x} = 0 \quad (6)$$

where we have assumed an inertial Kerr nonlinearity, $\Delta n = \gamma \langle I \rangle_\tau$ with a phase-independent, time-averaged response to the intensity $I=I(x,y,z)=\int f dk$ and reduced the discussion to one transverse dimension. The similarity of Eq. (5) to the Vlasov equation from plasma physics prompted Hall et al. to interpret the inhibition of nonlinear growth by the statistics as a type of Landau damping. See, Hall, B., Lisak, M., Anderson, D., Fedele, R. and Semenov, V. E., "Statistical theory for incoherent light propagation in nonlinear media," *Physical Review E* 65 (3), 035602 (2002). However, they did not identify plasma-like parameters, emphasize the resonant behavior of the damping, or consider the potential for inverse Landau damping (wave growth), with no threshold, when the underlying distribution is non-monotonic. All of these factors are crucial here.

Figure 1C:
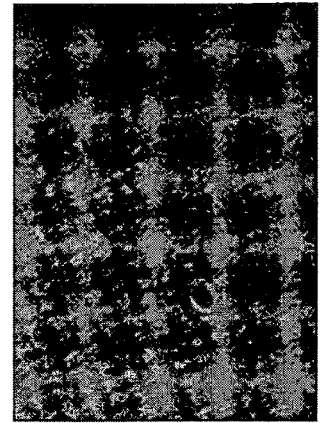
Figure 1B:
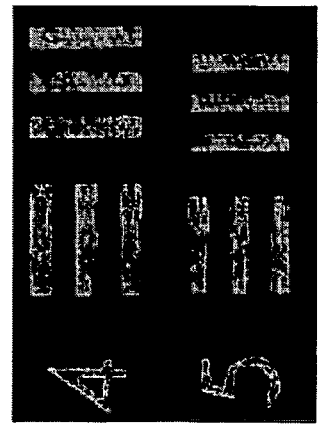

From the experiment, we are concerned with the quasi-thermal, Gaussian distribution of light created by the rotating diffuser of FIG. 1: $f_0(k_x)=(2\pi\Delta k^2)^{-1/2}I_0 \exp(-k_x^2/2\Delta k^2)$, where $\Delta k=2\pi/l_c$ represents the spectral spread for a beam with correlation length $l_c$. For long-wavelength perturbations, we take $a \ll g/(\beta k_x)$ and expand the denominator of Eq. (5), giving $$\frac{g^2}{\alpha^2\beta\gamma} \approx \int_{-\infty}^{\infty} f_0(k_x)\left[1 + 3\left(\frac{\alpha\beta}{g}\right)^2 k_x^2\right]dk_x \quad (7)$$

Next, we write $g=g_R+ig_I$ and assume that the growth/decay rate $|g_I| \ll |g_R|$. Explicitly accounting for the principal value and pole in the integral gives $$g_R = g_P(1 + 3\alpha^2\lambda_D^2/2) \quad (8)$$

$$g_I \cong \frac{\pi}{2}\gamma\alpha\sqrt{\frac{\gamma I_0}{\beta}} \cdot \left(\frac{\partial f_0}{\partial k_x}\right)\bigg|_{k_x=g/\alpha\beta} \quad (9)$$

where $g_P=\sqrt{\gamma I_0/\beta}$ is an effective plasma frequency and $\gamma_D=\beta\Delta k/g_P$ is an effective Debye length. Eq. (8) is a Bohm-Gross dispersion relation for nonlinear statistical light, showing that the statistical distribution responds to perturbations via Langmuir-type waves. Growth or damping of these waves is a resonant process that depends on the spectral shape of the distribution $f_0$ and the relative mode matching between the perturbation and the nonlinearity. For example, it is clear from Eq. (9) that there are no growing modes if $\delta f_0/\delta k_x < 0$. In contrast, non-monotonic backgrounds with regions of $\delta f_0/\delta k_x > 0$ have a "non-equilibrium" source of free energy which can drive instabilities. Classic examples of this are so-called "bump-on-tail" instabilities, well-known in plasma physics[8] and recently demonstrated in D. Dylov and J. Fleischer, "Observation of all-optical bump-on-tail instability," *Phys. Rev. Lett.* 100, 103903 (2008).

One advantage of the plasma-like scheme is the presence of the photonic Debye length, which serves as a compound, characteristic length of system. One major disadvantage is that the above expressions only hold in the limit of weak growth rates, so that highly-nonlinear phenomena like modulation instability are not captured at this level of approximation. On the other hand, the modes of Eqs. (8-9) can be used as a basis for stronger wave coupling. This is the approach used phenomenologically in the main text.

B. Strong Nonlinear Coupling

For stronger nonlinear coupling, higher-order terms from the sine operator ($\delta_r^3 \Delta n \cdot \delta_k^3 f$, etc.) in Eq. (4) become important. For a homogeneous distribution $f_0(k_x)$, the series represents a momentum translation and gives the dispersion relation $$1 = -\alpha\gamma \int_{-\infty}^{\infty} dk_x \frac{f_0(k_x + \alpha/2) - f_0(k_x - \alpha/2)}{g - \alpha\beta k_x} \quad (10)$$

This equation implicitly describes the evolution of the mutual coherence function $\langle \psi^*(x,z)\psi(x,z)\rangle_\tau$ and is also derivable directly from Eq. (2). Exact analytic solutions are possible for coherent plane waves [$f_0 = I_0 \delta(k_x - \kappa)$] and for incoherent beams with Lorentzian distributions $f_0(k_x) = I_0 (\Delta k/\pi)/(k_x^2 + \Delta k^2)$. This latter distribution appears in many contexts of noise, but its diverging second moment $\langle k_x^2 \rangle$ makes it an unphysical choice here. Nevertheless, using it in Eq. (10) gives:

$$\tilde{g} = -\tilde{\alpha}\theta_0 + |\tilde{\alpha}|\sqrt{\delta n - \left(\frac{\tilde{\alpha}}{2}\right)^2} \quad (11)$$

where $\theta_0 = \Delta k/k$ is the diffraction angle characterizing the coherence of the ensemble envelope, $\delta n = \gamma I_0/n_0$ is the fractional change of the refractive index due to nonlinearity, and "~" implies that the corresponding variable is expressed in the units of k (e.g. $\tilde{g} = g/k$). Soljacic, M., Segev, M., Coskun, T., Christodoulides, D. N., & Vishwanath, A., "Modulation instability of incoherent beams in noninstantaneous nonlinear media," *Physical Review Letters* 84 (3), 467-470 (2000). This formula shows clearly that the gain rate g of a perturbation mode α results from a competition between statistical spreading (de-phasing) and nonlinear coupling. It correctly predicts that intensity modulations will occur above a nonlinear threshold (for fixed beam statistics) and gives the dominant spatial scale $k_x^{max}$, obtained by taking the limit α→0. These features are generic and will hold for any underlying distribution. Other features, however, such as the growth rates of other modes and the turnover with nonlinearity, depend on the particular statistical details of the incoherent beam.

2. Coupling of Coherent and Spatially-Incoherent Light

In this section, the nonlinear coupling of coherent and spatially-incoherent light is considered. The presence of the coherent component immediately implies strong coupling, so that we will use the full dispersion relation (10). As mentioned above, the Gaussian distribution more accurately models the experiment and gives the correct dynamics of the modes, but it can be examined only in approximate form. A Lorentzian distribution, on the other hand, allows exact analytical solutions and also gives proper threshold behavior. Since we are primarily concerned with threshold behavior here, we will focus our discussion on the latter distribution.

For a coherent input combined with a Lorentzian ensemble, the total distribution takes the form $$f_0(k_x) = \frac{I_0}{2}\frac{\Delta k}{\pi(k_x^2 + \Delta k^2)} + \frac{1}{2}\sum_{m\geq 0}[J_m \delta(k_x + k_m) - J_{-m}\delta(k_x - k_m)], \quad (12)$$

where the signal has been decomposed into its constituent plane waves. To begin, it is instructive to consider the simplest case of one coherent plane wave with an intensity equal to that of the incoherent background, i.e. taking the limit $k_m = 0$, $J_0 = I_0$. Eq. (9) with (12) plugged in then yields $$\tilde{g} = -\frac{|\tilde{\alpha}|}{2}\theta_0 + \frac{|\tilde{\alpha}|}{2}\sqrt{\delta n - \tilde{\alpha}^2 + \theta_0^2 + [\delta n^2 + 4\theta_0^2(\delta n - \tilde{\alpha}^2)]^{1/2}}, \quad (13)$$

Figure 5:
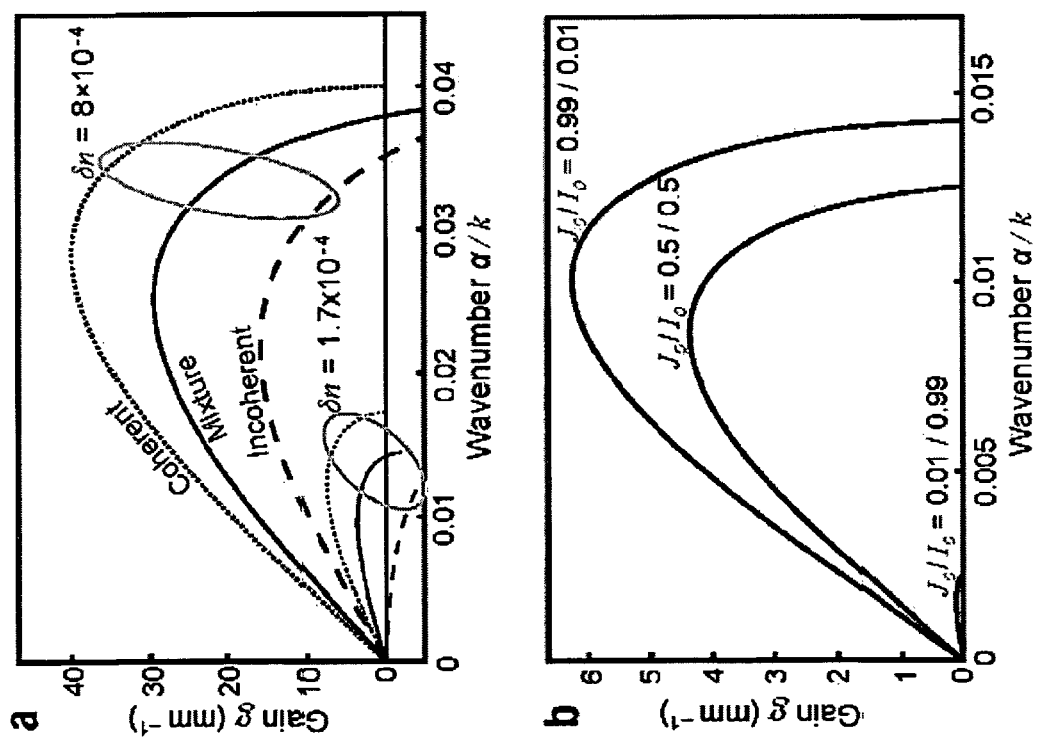
FIGS. 5(a) and (b) are graphs illustrating the growth rate of the mixture of coherent and incoherent components when their intensities are (a) equal and (b) varied. The mixture's curves are drawn in solid, the totally coherent case corresponding to the same $\delta n$ is drawn in dots, and statistical case—in dashes. The mixture's gain lies in between the two opposite limits. There is always a positive gain (even below the threshold of incoherent component).

In the purely incoherent limit, $J_0 \to 0$, Eq. (13) correctly retrieves the relation (11). In contrast, one can see analytically that with signal intensity $J_0 \neq 0$, the gain $\tilde{g} \geq 0$ for any intensity $I_0$ of the statistical light (provided $\delta n \geq \tilde{\alpha}^2/2$, a condition which is always satisfied for long wavelengths), implying that even for a very weak nonlinearity the mixture is unstable to perturbations. That is, there is no threshold for instability, as in the purely incoherent case. Note also that unlike incoherent MI, for which the growth rate (11) is separable into coherent and incoherent contributions, the dispersion relation for the mixture is intrinsically inseparable. FIG. 5(a) shows all the three gain curves ($\tilde{g}$, $\tilde{g}_{coh}$, $\tilde{g}_{incoh}$) drawn for two values of $\delta n$: when the incoherent contribution by itself is stable ($\delta n = 10^{-4}$, $\tilde{g}_{incoh} < 0$) and when it is unstable ($\delta n = 8 \times 10^{-4}$, $\tilde{g}_{incoh} > 0$). In both cases the curve for $\tilde{g}$, given by the exact formula (13), lies between the coherent and incoherent curves, indicating graphically the coupling between the two components.

Equation (13) is valid only for a 50/50 mixture of coherent and incoherent light. To study an arbitrary mixture, we varied the intensity ratio of coherent and incoherent components and studied Eq. (10) numerically. The results, presented in FIG. 5, demonstrate that any amount of coherent component makes a mixture unstable, for any degree of self-focusing nonlinearity. At first thought, this may seem surprising and somewhat counterintuitive, since the statistical light serves to de-phase mode coupling. However, the presence of a spatially-coherent component means that there is an intensity source that is always in-phase with a perturbation mode, allowing it to extract energy as it propagates. Experimental support for this behavior, obtained from the setup in FIG. 1 with the chart replaced by a plane wave, is given in FIG. 6(a).

Figure 6:
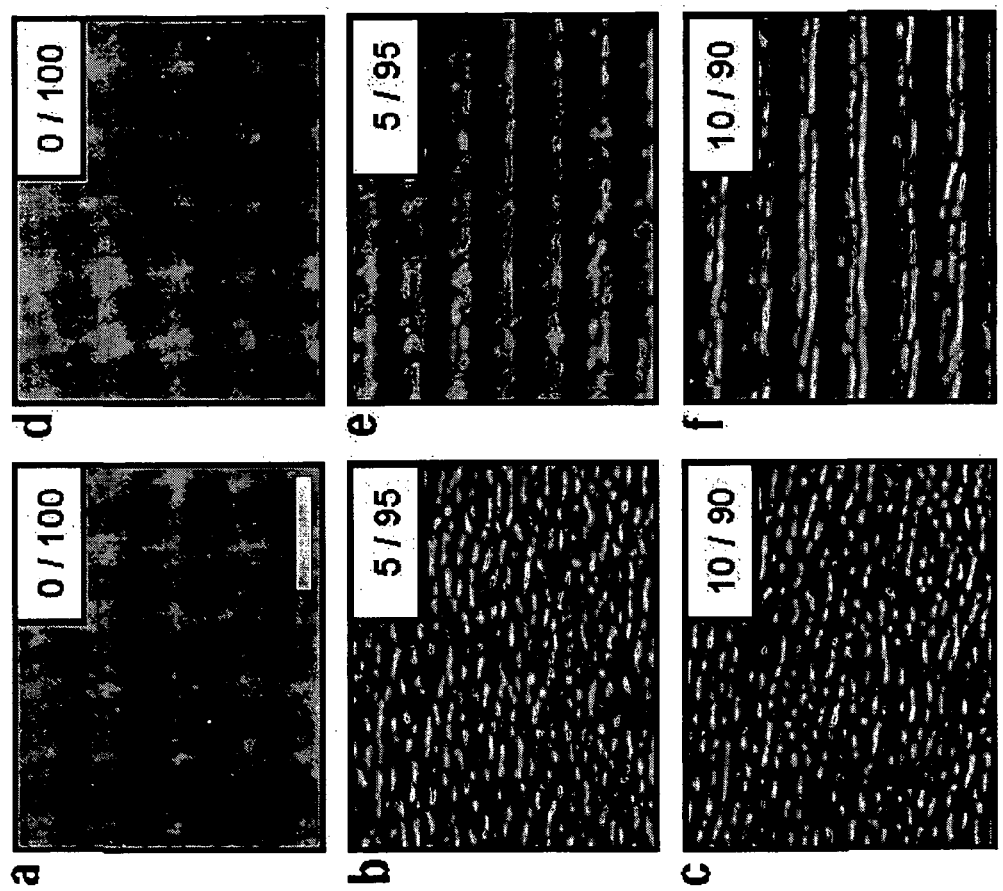
FIG. 6 is a series of illustrations showing experimental results of nonlinear coupling between coherent and incoherent components. Output pictures are shown after 1 cm of propagation for a plane wave in FIGS. 6(a)-(c) and a cosine pattern coupling with a partially-coherent background for FIGS. 6(d)-(f). In each case, the background has a correlation length $l_C=110$ μm and the nonlinearity is fixed at $\delta n=1.7\times10^{-4}$ (below the modulation instability threshold for the purely incoherent beam). Insets show the coherent/incoherent intensity ratio for each frame. The scale bar is in 100 μm.

The only information content in the plane-wave "signal" is its intensity, and it is this parameter which characterizes the length scale of the output modulations. For a signal with more information, such as a cosine wave, there is a competition between the input length scale and the growth of perturbations. For weak nonlinearity, the initial cosine period is dominant (FIG. 6). Like the plane-wave seed, there is no instability for threshold. Unlike the previous case, though, the cosine sets the dominant spatial scale. For stronger nonlinearity, higher-order modes are generated by coherent modulation instability of the cosine, incoherent MI of the statistical background, and further wave mixing. The details of this instability depend on the presence and structure of the underlying coherent mode.

The nonlinear response of the coherent signal is crucial to the propagation dynamics. While there is a danger in extrapolating results from these limited samples to an ensemble of inputs required to analyze information capacity, it is safe to stress the importance of a coherent seed for details of the capacity rollover. Further, the Gaussian form of our input-output correlation suggests that it will carry over into the ensemble case as well.

Finally, the treatment here is essentially a coupled-wave model, with the coherent signal interacting with the incoherent background as a whole. That is, we associate an envelope phase with the background distribution and a characteristic propagation constant determined by the mean spectral spread. This explains the observed energy transfer, giving an input-output cross-correlation proportional to the gain, and the (nonlinear) matching condition $k_z^{cos} = \langle k_z^{dist} \rangle$ presented in the text. Through the paraxial dynamics, the spatial extent of the waves determines their propagation. Further, the dynamics remains conservative throughout the signal evolution. Unlike previous synchronization studies (see, Freund, J. A., Schimansky-Geier, L., & Hanggi, P., "Frequency and phase synchronization in stochastic systems," *Chaos* 13 (1), 225-238 (2003)), the optical system here is strictly non-dissipative. Also, the "phase" dynamics follow from intensity-induced effects, rather than from a potential energy functional of the phase itself. With respect to coherence, this conservation implies that correlations in the wavefunction become spatially-dependent, e.g. through waveguiding effects. The dynamics of these correlations will be the subject of future work.

3. Comments on the Development of the Resolution Chart

For a signal with many modes, such as the resolution chart, the dynamics becomes considerably more complicated. Internal wave mixing is more likely, and there are more mode-matching opportunities with the statistical background. While a full theory remains to be developed, much intuition can be obtained by generalizing the above results to multi-mode seed waves. For this, we assume that the incoherent background can be approximated as a central Gaussian distribution (initial noise) with M additional Gaussian beams, each with the same statistics (correlation length $l_c$) but positioned at different spatial frequencies (angular separations) $\delta k_{01}, \delta k_{12}, \delta k_{23}, \ldots, \delta k_{M-1\ M}$:

$$f_0(k_x) = \frac{1}{\sqrt{2\pi}\,\Delta k}\left[I_0 e^{-\frac{k_x^2}{2\Delta k^2}} + \sum_{j=1}^{M} I_j e^{-\frac{(k_x - \delta k_{j-1,j})^2}{2\Delta k^2}}\right] \quad (13)$$

Following the same derivation as in Section 1, we find that the photonic plasma frequency now depends on the total intensity $$I_{tot} = \sum_{j=0}^{M} I_j$$

of the individual intensities $I_j$, while the photonic Debye length becomes[9]

$$\lambda_D = \sqrt{\frac{1}{\gamma\beta}\left(\frac{\Delta k^2}{I_{tot}} + \sum_{j=1}^{M} \frac{\delta k_{j-1,j}^2}{I_j}\right)} \quad (14)$$

See, Dylov, D. V. & Fleischer, J. W., "Multiple-stream instabilities and solution turbulence in photonic plasma," *Physical Review A* 78, 061804 (2008).

Figure 7:
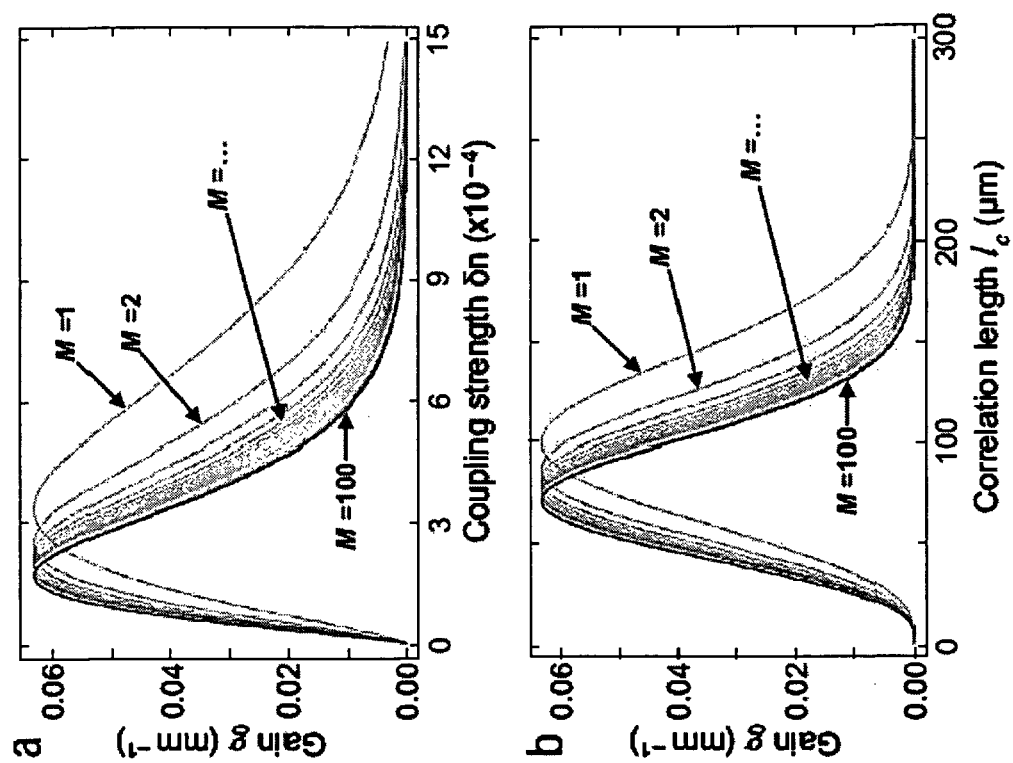
FIGS. 7(a) and (b) are graphs illustrating theoretical growth rates of a multimode signal.
FIG. 7(b) shows the dependence of gain rate on correlation $l_C$. The coupling strength is fixed at $\delta n=1.7\times10^{-4}$.

With more beamlet contributions, the effective Debye length increases. That is, the statistical beam becomes more incoherent, meaning that signals are de-phased quicker. This is shown numerically in FIG. 7, both for fixed base correlation length IC and for fixed nonlinearity. Qualitatively, the shift in the peak is the same as in the experiment, though there is no change in its amplitude, an invariance attributable to the lack of (envelope) phase information in this intensity-only model. This result is opposite to the intuition gained from previous instability studies, in which more incoherence (shorter effective correlation length) leads to a higher nonlinear threshold for the appearance of modulations. This indicates again that the peak is not due to modulation instability of the background alone, and nonlinear coupling with the underlying signal is necessary to explain the results.

As discussed above, evolving the distribution $f(x,k,z) = f_0(k) + f_1 \exp[i(\alpha x - gz)]$ gives the growth rate $$g \cong \frac{\pi}{2}\gamma\alpha\sqrt{\frac{\gamma I_0}{\beta}} \cdot \left(\frac{\partial f_0}{\partial k}\right)\bigg|_{k=\gamma I/\alpha} \quad (8)$$

for a perturbation mode with wavenumber $\alpha$. This relation is identical to the Landau formula for electrostatic modes in a charged gas, implying that the statistical light of the background can be treated as a photonic plasma. By analogy, then, the coupling of the signal to the incoherent background is identical to a beam-plasma interaction. Such an interaction is inherently resonant, requiring a mode matching between the driving term (perturbation) and the underlying distribution, and has no threshold for instability.

For a purely incoherent beam, described by Eq. (1), intensity modulations do appear when the nonlinearity $\gamma I$ overcomes the statistical spreading $\Delta k^2 \sim l_c^{-2}$. This dynamic cannot be described properly by Eq. (16), since its derivation breaks down for even moderate wave coupling. On the other hand, it is reasonable to use the modes from this theory as a basis for further interactions. These interactions lead to new features, such as particle trapping (optical waveguiding) due to induced potentials. Unlike simple waveguides, including solutions, which have fixed profiles that passively channel light, the dynamics here involves mutual interaction. More specifically, there is a positive feedback loop: the very weak (initially hidden) signal first seeds a potential which concentrates the noise; in turn, nonlinear coupling amplifies the signal and reinforces the potential. We emphasize that modulation of the incoherent light alone is not enough to trigger the intensity dynamics; rather, there must be a coherent component to provide a steady source of free energy. As discussed above, the addition of any amount of coherent signal acts as a source of instability for any degree of nonlinearity. The dynamical evolution of the signal means that, even for detectors with finite thresholds, detection will occur if the propagation distance (evolution time) is long enough.

By energy conservation, loss in the noise corresponds to gain in the signal. A detailed account of the coupling would require forays into wave turbulence theory that are beyond the scope of this Letter. Instead, we adopt an effective theory in which the interactions are absorbed into parameters of the growth rate:

$$g_{eff}(A, B; \alpha, \gamma, l_c) \cong A\sqrt{\frac{\pi}{8}} \cdot \frac{(\gamma I_0)^2 l_c^3}{\alpha^3 \beta^5} \exp\left(-\frac{B}{2}\frac{\gamma I_0 l_c^2}{\alpha^2 \beta^3}\right) \quad (15)$$

where A and B are mode-dependent normalization factors giving the height and location of the visibility peak. Consistent with the quasi-thermal light used in the experiment, the background distribution has been written $f_0(k_x)=(2\pi\Delta k^2)^{-1/2} I_0 \exp(-k^2/2\Delta k^2)$. Equation (15) has the exponential (Boltzmann-like) form of stochastic resonance, with the potential energy determined by self-action $\gamma I_0$ and the driving noise characterized by $l_c$.

Figure 4:
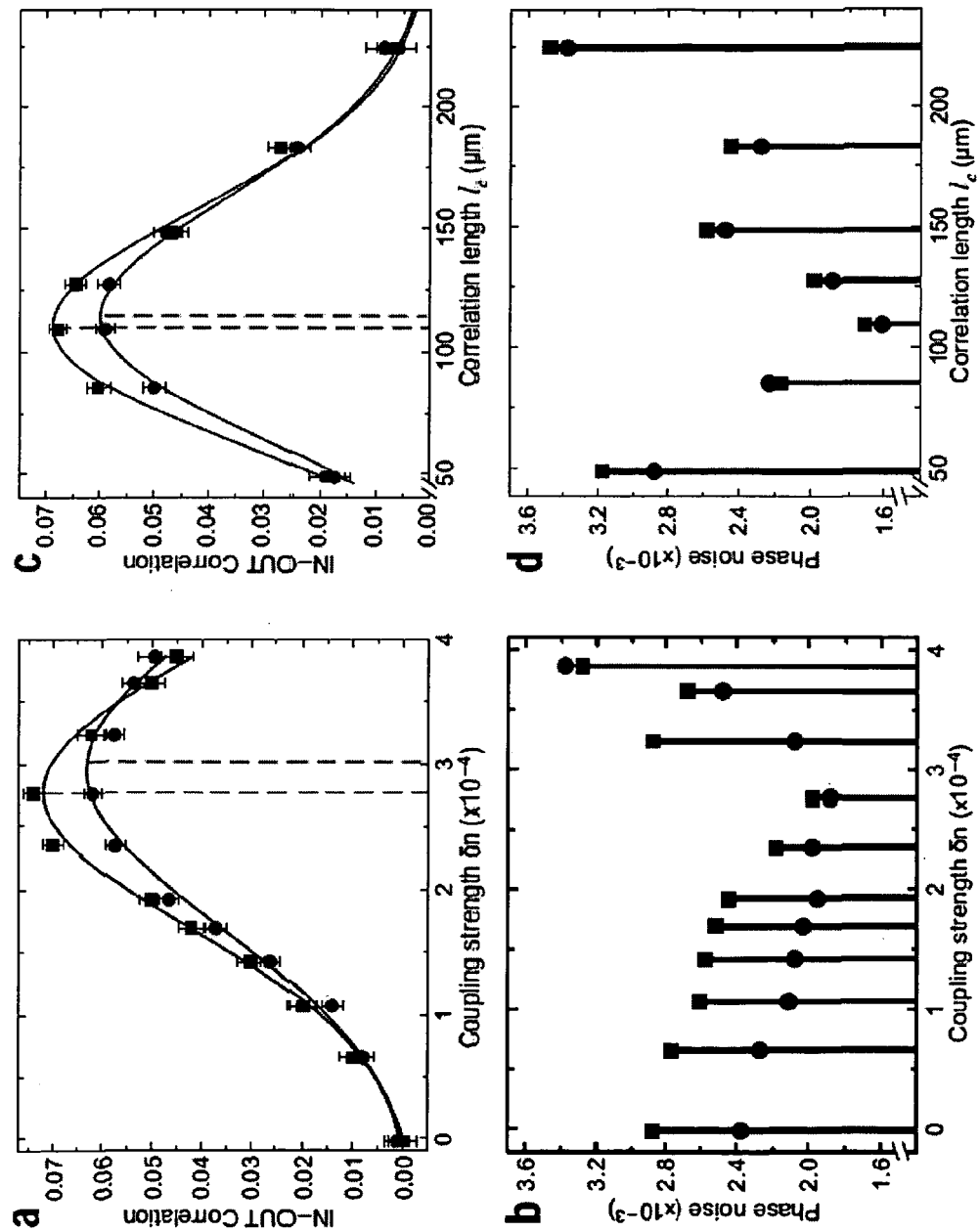
FIGS. 4(a)-(d) are graphs illustrating experimental measurements and analytical fits of dynamical stochastic resonance. Spatial cross-correlation, a, b, and phase noise, c, d, of signal+noise output image (within measurement window highlighted in FIG. 2(g) with pure signal input. a, b, Measurements (points) and analytical fit (solid line, from Eq. (4) of Cin,out for resolution chart (■) and cosine wave (●) as a function of, a, nonlinear coupling strength $\delta n$ for fixed correlation length lc=110 μm and, b, correlation length for fixed nonlinear coupling strength $\delta n=1.7\times10-4$. Both signals have the same 50 μm period and are coupled with the same noise, showing that the height and location of the resonance depends on the modal content of the signal. c, d, Phase noise (variance in a, b) obtained by comparing different cross-sectional slices within the measurement window. The smallest variance occurs for the peak values of $\delta n$ and lc, indicating a coherence resonance when the propagation constant of the signal matches the envelope phase of the noise.

For concreteness, we focus on the horizontal bars of the resolution chart. Even in this simplified case, there are many scales which contribute, including the width and spacing of the bars as well as the modes which characterize the well-defined edges. As a reference, we start with the dominant mode of the chart: a pure cosine mode with the same period $2\pi/k_{cos}^{-1}$ as the bar spacing of the chart. FIG. 4a shows a result of Eq. (15) for the visibility as a function of the nonlinear coupling strength, for a fixed correlation length $l_c$~110 µm. For the pure cosine mode, the fitting parameters are A=1.3 and B=500. Then, keeping A and B the same, we fix the nonlinear index change at $\Delta n/n_0=1.7\cdot 10^{-4}$ and vary the correlation length. As shown in FIG. 3b, this theoretical curve matches the measured data extremely well, even though it is a separate experiment from the previous one. It is clear from this correlation figure that resonance occurs when the propagation constant $k_z=k_{cos}^2(n_0+\Delta n_{cos})$ of the cosine matches the average (envelope) propagation constant $\langle k_z\rangle(=)k_x^2(n_0+\Delta n_{dist})\rangle \sim l_c^{-2}(n_0+\langle\Delta n_{dist}\rangle)$ of the distribution. This phase synchronization, a hallmark of spatial coherence resonance, is also evident from the reduced measurement noise (smaller error bars) in FIG. 4.

For the resolution bars, many modes contribute to the square-wave profile. These modes interact with each other and couple differently to the incoherent background, leading to a shift in the location and height of the visibility peak. However, the overall form of the visibility profile (3) is preserved, with the A- and B-coefficients now given by 1.6 and 530, respectively.

The form (5) of the output-input correlation is Gaussian in correlation length, amplitude, and modal number, suggesting that the mutual information of the system is also Gaussian[30]. This suggests that the channel capacity of the system (maximum of the mutual information) has an exponential fall-off in intensity. On the other hand, the underlying image is spatially-extended, and a full information-theoretic treatment of noisy dynamics in these systems is still being developed.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

What is claimed is:

1. A method for recovering a signal comprising the steps of:
   coupling a signal and incoherent background noise together to produce a mixed signal;
   propagating the mixed signal over a distance in a nonlinear medium to amplify the signal at the expense of the incoherent background noise, wherein nonlinearity of said nonlinear medium is controllable; and
   extracting said signal from said mixed signal by tuning a parameter of said signal, said noise, or said medium;
   wherein said step of propagating said mixed signal comprises propagating said mixed signal in a self-focusing photorefractive crystal.

2. A method for recovering a signal according to claim 1, wherein said step of extracting said signal comprises the step of tuning the nonlinearity of said nonlinear medium.

3. A method for recovering a signal according to claim 2, wherein said step of propagating said mixed signal comprises propagating said mixed signal in a self-focusing photorefractive crystal.

4. A method for receiving a signal according to claim 1, wherein said step of tuning said nonlinearity of the mixed signal comprises varying an applied voltage across a crystalline axis of said photorefractive crystal.

5. A method for recovering a signal according to claim 1, wherein said step of coupling said signal to said incoherent background noise comprises fixing a signal-to-noise ratio to completely obscure said signal.

6. A method for recovering a signal according to claim 1, wherein said step of extracting said signal comprises the step of tuning the intensity of the incoherent background noise.

7. A method for recovering a signal according to claim 1, wherein said step of extracting said signal comprises the steps of tuning the statistics of the background noise.

8. A method for recovering a signal according to claim 4, wherein said statistics of the noise are controlled by an imaging lens and said step of tuning the statistics of the noise comprises controlling said imaging lens.

9. A method for recovering a signal according to claim 1, wherein said step of extracting said signal comprises the step of tuning the wavelength of the background noise.

10. A method for recovering a signal according to claim 1, wherein said step of extracting said signal comprises the step of tuning the wavelength of the signal.

11. A method for recovering a signal according to claim 1, wherein said signal comprises an image signal.

12. A method for recovering a signal according to claim 1, wherein said incoherent background noise comprises diffused laser light.

13. A method for recovering a signal according to claim 1, wherein said step of coupling a signal and incoherent background noise together to produce a mixed signal completely obscures the signal.

14. A system for recovering a signal comprising:
   means for coupling a signal and incoherent background noise together to produce a mixed signal;
   a tunable nonlinear medium connected to an output of said means for coupling; and
   means for recovering a signal of interest by tuning a nonlinear response of said tunable nonlinear medium;
   wherein said tunable non-linear medium comprises a self-focusing photorefractive crystal.

15. A system for recovering a signal according to claim 2, wherein said parameter is selected from the group of the strength of the nonlinearity of the mixed signal, the intensity of the incoherent background noise, the statistics of the incoherent background noise and a noise wavelength.

16. A system for recovering an image signal comprising:
a receiver for receiving a signal of interest;
a source of incoherent noise;
a combiner for coupling said signal of interest to incoherent background noise from said source of incoherent noise to produce a mixed signal;
a controllable nonlinear propagation medium connected to said combiner for propagating said mixed signal over a distance;
a camera for receiving said mixed signal after it propagates over said distance; and
a controller for tuning parameters of said combiner and said source of incoherent noise;
wherein said controllable nonlinear propagation medium comprises a self-focusing photorefractive crystal.

17. A method for recovering a signal according to claim 1, wherein said nonlinearity of said nonlinear medium is controllable by varying an external bias voltage.

18. A system for recovering a signal according to claim 16, wherein said controllable nonlinear propagation medium comprises a self-focusing photorefractive crystal.

* * * * *